United States Patent [19]
Albert et al.

[11] Patent Number: 5,668,499
[45] Date of Patent: Sep. 16, 1997

[54] TUBE TYPE POWER AMPLIFIER WITH DISTORTION CONTROL

[75] Inventors: James Robert Albert; Jack C. Sondermeyer, both of Meridian, Miss.

[73] Assignee: Peavey Electronics Corporation, Meridian, Miss.

[21] Appl. No.: 586,596

[22] Filed: Jan. 16, 1996

[51] Int. Cl.⁶ .................................. H03F 3/28; H23G 3/22
[52] U.S. Cl. .......................... 330/118; 330/136; 330/145; 330/149
[58] Field of Search ..................... 330/118, 136, 330/144, 145, 149

[56] References Cited

U.S. PATENT DOCUMENTS

| | | |
|---|---|---|
| 1,734,219 | 11/1929 | Lorance . |
| 2,221,541 | 11/1940 | Hathaway . |
| 2,552,136 | 5/1951 | Beurtheret ........................ 330/136 |
| 2,713,620 | 7/1955 | Tilley . |
| 2,768,249 | 10/1956 | Rockwell . |
| 2,930,987 | 3/1960 | Groce et al. . |
| 3,248,642 | 4/1966 | Rothschild . |
| 4,048,573 | 9/1977 | Evans et al. . |
| 4,318,053 | 3/1982 | Sondermeyer . |
| 4,581,589 | 4/1986 | Ikoma . |
| 4,701,717 | 10/1987 | Radermacher et al. . |
| 5,327,101 | 7/1994 | Neely et al. .................. 330/136 X |

*Primary Examiner*—James B. Mullins
*Attorney, Agent, or Firm*—Watson Cole Stevens Davis, P.L.L.C.

[57] ABSTRACT

A power amplifier has a distortion control circuit responsive to a clipping detector for loading said amplifier input with a signal sufficient to reduce the input to the tube grids to a level below clipping.

6 Claims, 2 Drawing Sheets

1

TUBE TYPE POWER AMPLIFIER WITH DISTORTION CONTROL

BACKGROUND OF THE INVENTION

The invention pertains to a power amplifier circuit, and in particular to tube power amplifier with a distortion detection circuit and a responsive control circuit for reducing distortion.

Power amplifier circuits with distortion reduction means are known, as exemplified in U.S. Pat. No. 4,318,053. The '053 patent, known as Distortion Detection Technique (DDT), discloses a solid state amplifier with automatic distortion control. The amplifier is provided with a detector between the amplifier output and feedback ports for detecting a nonlinear condition with a balanced differential circuit connected to the detector and feeding a full wave threshold detector which charges a storage capacitor proportionally to the percent clipping of the output signal of the amplifier. The storage capacitor is discharged into an input variable gain amplifier in the amplifier input circuit to reduce the gain for minimizing clipping.

The DDT circuit in the '053 patent is for a solid state amplifier circuit. It is desirable to employ DDT for tube type power amplifiers to thereby avoid clipping when a signal is fed into the input of the power amplifier that would normally be sufficient to clip the power amplifier.

SUMMARY OF THE INVENTION

The present invention is based upon the discovery that a solid state circuit may be employed in a tube power amplifier to detect and reduce distortion in the amplifier.

The detector for the tube amplifier compares the grid voltage to a reference voltage. When the grid goes positive, i.e., when the tube power amp clips, the detector produces a pulse (positive going) whose width is proportional to the amount of time the signal is clipped. In a push/pull design, a pulse is produced when either the positive or negative portion of the signal is clipped. The pulse is then rectified and filtered to produce a DC level proportional to the amount of signal clipping. The DC level is used to control the gain of an operational transconductance amplifier (OTA), which controls the system gain for the circuit.

DESCRIPTION OF THE INVENTION

Figure 1:
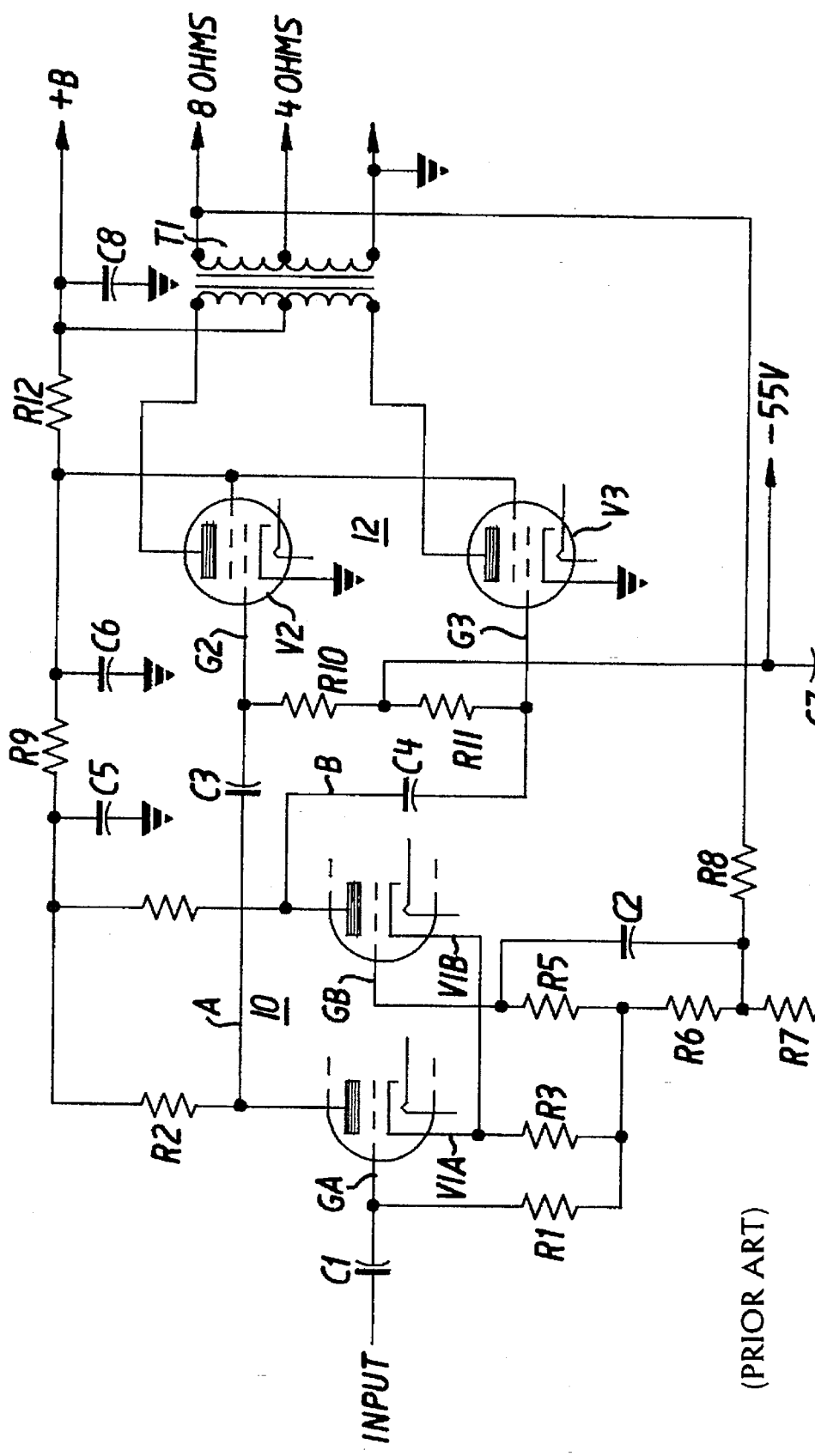
FIG. 1 is a schematic diagram of a push/pull tube power amp.

Referring to FIG. 1, input signals are coupled via C1 to the grid of V1A which is half of what is known as a "long tailed" phase inverter circuit 10. The purpose of the phase inverter 10 is to supply two out of phase signals A and B to a push/pull amplifier 12 which comprises output tubes V2 and V3 in a Class B configuration. The cathodes of V1A and V1B are connected together. Thus, V1A operates in a grounded cathode mode, while V1B operates in a grounded grid mode with respect to the input grid of V1B. Thus, equal but out of phase signals A and B appear at the plates of V1A and V1B. Resistor R3 commonly connected to the cathodes of V1A and V1B sets the bias for each tube; R1 and R5 are the grid bias resistors; R6 is the common cathode to ground resistor; and R7 is used to introduce feedback from the output to reduce overall distortion. The grid of V1B is shunted to ground (in this case, the low impedance feedback point) via capacitor C2, as is necessary for grounded grid operation. Resistors R2 and R4 are the respective plate loads for V1A and V1B. The respective plate signals A and B are coupled to the output tubes via C3 and C4. Each output tube grid is connected to a −55 volt bias source via resistors R10 and R11. This −55 volt source is generated externally from this circuit and is filtered adequately by capacitor C7. Negative 55 volts is chosen as the proper value to bias the output tubes (6L6GC's) into Class B operation with minimal crossover distortion at low signal levels.

Completing the circuit, R8 is a feedback resistor; R9 and R12 are power supply decoupling resistors; C5, C6 and C8 are filter capacitors for the various supply sources in the B+ circuit. T1 is a tube push/pull output transformer, in this case with output taps for 8 and 4 ohms. The power amplifier shown in FIG. 1, will deliver approximately 50 WRMS to the matching load value.

At all signal levels below output clipping (the output waveform being clean and free of distortion), the signal levels at the respective grids G2 and G3 of output tube V2 and V3 will be well below 55 volts peak swing, and the average DC bias level at each output tube grid will be −55 VDC. However, at output clipping and beyond, the signal levels at each output tube grid G2 and G3 will exceed +55 volts peak swing, and thus, the grid will be biased positive with respect to the cathode at each positive peak signal swing. Whenever the grid is driven positive with respect to the cathode, it becomes a simple forward biased diode. Hence, this diode will cause the average negative DC bias voltage level at each output tube grid to increase in proportion to the overload input value above the clipping value. Thus, the output tubes V2 and V3 will be over biased beyond Class B and at severe output clipping significant crossover distortion will be generated as well.

Figure 2:
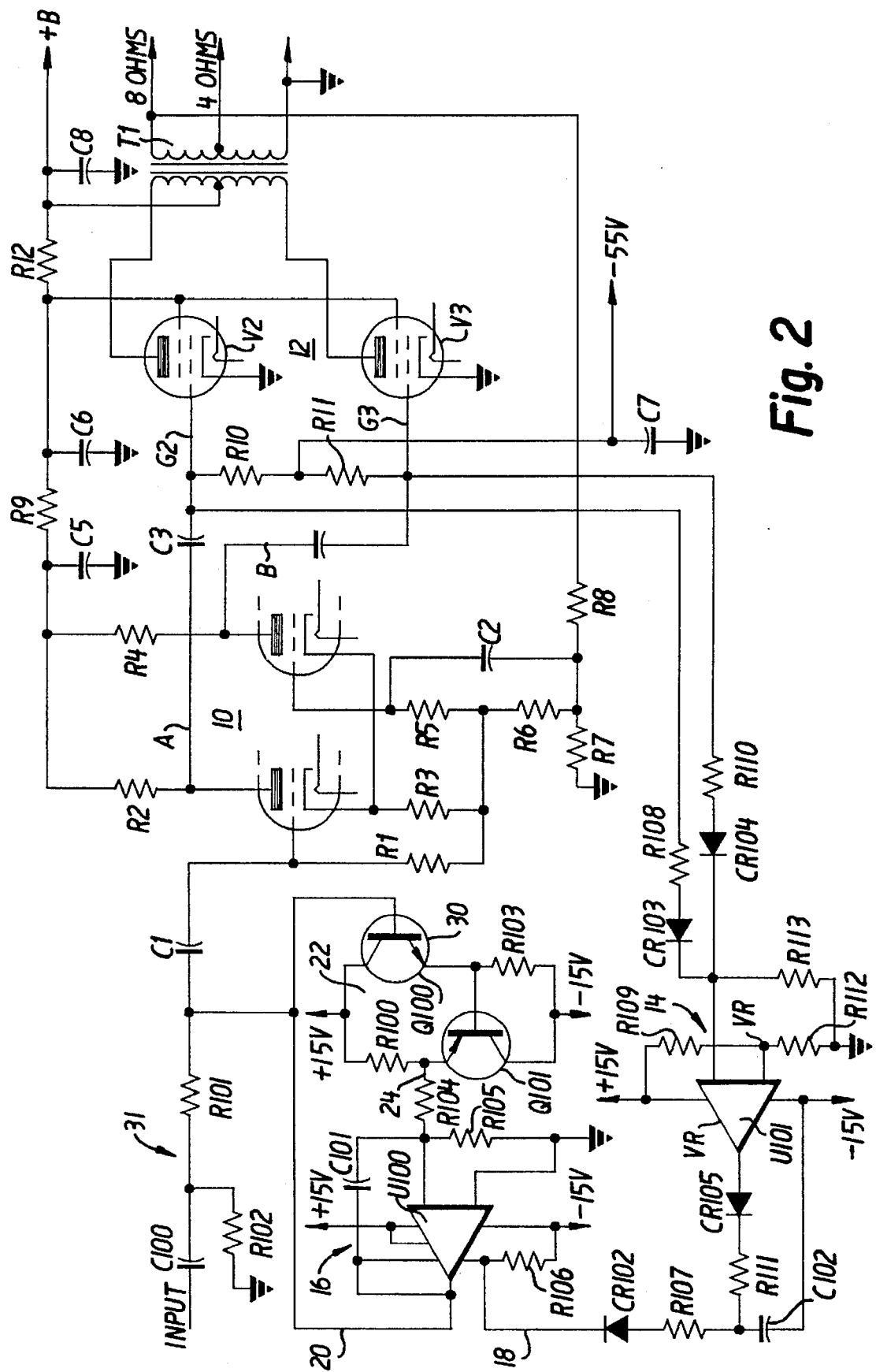
FIG. 2 is a schematic diagram of the push/pull tube power amp of FIG. 1 with the distortion control according to the invention.

In accordance with the invention, as shown in FIG. 2, where similar reference numbers are used, inverter 10 drives amplifier 12. Detector 14, coupled to amplifier 12, detects clipping and produces a detector output to distortion control circuit 16 connected to the input of the inverter 10. The grid G2 and G3 of each respective power tube V2 and V3 is commonly connected to the non-inverting input of operational amplifier U101 of detector 14 through a network formed by R108, R110, CR103, CR104 and R113. This network isolates and divides the signal down by a ratio of ½ (R108 or R109 and R113) minus the drop of the forward biased diode CR103 or CR104 when the grid signal A or B plus bias voltage exceeds the forward bias voltage of the corresponding diode.

The inverting input of U101 is biased by a divider network formed by R109 and R112. The voltage present at the inverting input is simply a reference voltage VR derived from the +15 volt supply to an appropriate level (approximately 0.3 volts).

When there is no signal present or when the signal is such that the power amplifier V2/V3 is not in a clipped condition, the output of U101 is at −15 V. With such a signal, the detector 14 is not active and no distortion control is achieved. When the signal A or B into the power amplifier is sufficient, the amplifier will "clip" and the grids G2 and G3 of the power tubes V2, V3 will go positive. This in turn forward biases diodes CR103 and CR104. At this point, the voltage present at the noninverting input of U101, is greater than the reference voltage VR at the inverting input. This causes the output of U101, to swing to +15 volts from the initial −15 volts for a duration equal to the clipped portion of the output signal.

The input signals A and B present at the grids G2 and G3 of respective power tubes V2 and V3 are out of phase by 180 degrees, by virtue of the phase inverter 10. Thus, the grid of one power tube will go positive while the other remains negative. The fact that the grid of the power tube is going positive is a clear indication that the power amplifier 12 is clipping. Anytime that either one of the grids of the power tubes goes positive, the respective diodes (CR103 or CR104) will be forward biased. In a symmetrically clipped condition both diodes (CR103 and CR104) will be alternately forward biased 180 degrees out-of-phase. In either case, the output of U101 in detector 14 (acting as a comparator) will swing positive. The duty cycle of the output of U101 is a function of how hard the amplifier is "clipping". Pulses 180 degrees apart will be present at the output of U101 as long as the amplifier is clipping.

The positive pulses present at the output of the detector 14 are rectified by CR105. These pulses, in turn, charge capacitor C102 through R111. The rate at which C102 charges is determined by R111. This controls the attack time of the distortion control circuit 16.

When the voltage on the capacitor C102 starts charging in the positive direction, current will start to flow through R107 and CR102 to operational transconductor amplifier U100 in distortion control circuit 16. As long as the voltage present at the positive terminal of C102 is more positive than the voltage present at gain control input 18 of U100, current will flow through CR102 and R107. The gain of U100 is dependent on the current (Iabc) through control input 18 of U100, the gain of U100 is controlled by the amount of clipping that is detected by U101. R106 maintains U100 off when no clipping is detected by keeping control input 18 at −15 volts. This means there is no current, Iabc =0, to turn on U100.

The system gain is controlled by the amount of current (Iabc) that is drawn from control input 18 of U100 during clipping. U100 controls the system gain by introducing an out-of-phase signal at the output 20 to effectively load input resistor R101 (i.e., either sourcing or sinking current through R101). This action effectively reduces the gain of the system when a signal sufficient to drive the power amplifier into clipping is encountered.

The input circuit 31 comprising R101, R102, is coupled via C1 to the phase inverter 10. Q100, R100, Q101 and R103 forms a unity gain follower 22. This isolates the input of circuit 31 from the loading of voltage divider R104, R105 at the input of U100 which receives the input signal. This divider drops the input signal to a level that is acceptable for U100. Capacitor C101 provides high frequency roll off for U100. C100 couples the input signals to the input circuit 31 and R102 provides the ground reference for the input circuit 31.

While there have been described what are at present considered to be the preferred embodiments of the present invention, it will be apparent to those skilled in the art that various changes and modifications may be made therein without departing from the invention, and it is intended in the appended claims to cover such changes and modifications as fall within the spirit and scope of the invention.

What is claimed is:

1. A circuit for reducing the gain of a push/pull tube power amplifier having grids for receiving an input signal, below a level sufficient to cause the amplifier to clip the output, comprising:

a detector having an input port, a reference port and an output, the input port adapted to be commonly coupled to the grids of the tubes for sensing the input signal, and the reference port being adapted to be coupled to a reference;

said detector producing an output when the input signal exceeds a level sufficient to cause clipping in the amplifier, said output having a duration proportional to the time the input exceeds said level; and a distortion control circuit having an input responsive to the detector and an output adapted to be coupled to the input of the power amplifier for loading the input in response to the detector output.

2. The circuit of claim 1 wherein the detector comprises a comparator having an input responsive to the grid signal and a reference input proportional to the clipping level of the amplifier.

3. The circuit of claim 1 wherein the distortion control circuit comprises an operational transconductance amplifier having a gain control input responsive to the detector output for controlling the gain thereof.

4. The circuit of claim 1 further including an input circuit for isolating the amplifier input from the distortion control circuit.

5. The circuit of claim 4 wherein the distortion control circuit has an input coupled the output of the input circuit.

6. A circuit for reducing the gain of a tube power amplifier having a grid for receiving an input signal, below a level sufficient to cause the amplifier to clip the output, comprising:

a detector having an input port, a reference port and an output, the input port adapted to be commonly coupled to the grid of the tube for sensing the input signal, and the reference port being adapted to be coupled to a reference;

said detector producing an output when the input signal exceeds a level sufficient to cause clipping in the amplifier, said output having a duration proportional to the time the input exceeds said level; and a distortion control circuit having an input responsive to the detector and an output adapted to be coupled to the input of the power amplifier for loading the input in response to the detector output.

\* \* \* \* \*